United States Patent
Iin et al.

(10) Patent No.: US 8,043,959 B2
(45) Date of Patent: Oct. 25, 2011

(54) METHOD OF FORMING A LOW-K DIELECTRIC LAYER WITH IMPROVED DAMAGE RESISTANCE AND CHEMICAL INTEGRITY

(75) Inventors: Keng-Chu Iin, Chao-Chou Ping-Tung (TW); Chia Cheng Chou, Keelung (TW); Ming-Ling Yeh, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 378 days.

(21) Appl. No.: 11/379,708

(22) Filed: Apr. 21, 2006

(65) Prior Publication Data

US 2007/0249179 A1   Oct. 25, 2007

(51) Int. Cl.
*H01L 21/4763* (2006.01)

(52) U.S. Cl. . 438/626; 438/631; 438/637; 257/E21.576; 257/E21.58; 257/E21.582

(58) Field of Classification Search .................. 438/626, 438/631, 637; 257/E21.576, E21.577, E21.58, 257/E21.582

See application file for complete search history.

(56) References Cited

U.S. PATENT DOCUMENTS

| | | | |
|---|---|---|---|
| 6,787,803 B1 | 9/2004 | Yao et al. | |
| 6,794,295 B1 | 9/2004 | Lin et al. | |
| 6,846,756 B2 | 1/2005 | Pan et al. | |
| 6,867,126 B1 | 3/2005 | Li et al. | |
| 2002/0132468 A1* | 9/2002 | Wong | 438/627 |
| 2003/0211814 A1* | 11/2003 | Shih et al. | 451/36 |
| 2004/0101667 A1* | 5/2004 | O'Loughlin et al. | 428/209 |
| 2005/0064698 A1* | 3/2005 | Chang et al. | 438/623 |
| 2005/0081885 A1* | 4/2005 | Zhang et al. | 134/2 |
| 2005/0199264 A1* | 9/2005 | Andreas | 134/2 |
| 2006/0094256 A1* | 5/2006 | Weber | 438/778 |
| 2006/0189133 A1* | 8/2006 | Dimitrakopoulos et al. | 438/687 |

FOREIGN PATENT DOCUMENTS

| | | |
|---|---|---|
| CN | 1502123 A | 6/2004 |
| CN | 1832128 A | 9/2006 |

OTHER PUBLICATIONS

Chinese Office Action issued Oct. 31, 2008.

* cited by examiner

*Primary Examiner* — Asok Sarkar
*Assistant Examiner* — Julia Slutsker
(74) *Attorney, Agent, or Firm* — Duane Morris LLP; Won Joon Kouh

(57) ABSTRACT

A method of forming a low-k dielectric layer or film includes forming a porous low-k dielectric layer or film over a wafer or substrate. Active bonding is introduced into the porous low-k dielectric layer or film to improve damage resistance and chemical integrity of the layer or film, to retain the low dielectric constant of the layer and film after subsequent processing. Introduction of the active bonding may be accomplished by introducing OH and/or H radicals into pores of the porous low-k dielectric layer or film to generate, in the case of a Si based low-k dielectric layer or film, Si—OH and/or Si—H active bonds. After further processing of the low-k dielectric film, the active bonding is removed from the low-k dielectric layer or film.

21 Claims, 5 Drawing Sheets

1

METHOD OF FORMING A LOW-K DIELECTRIC LAYER WITH IMPROVED DAMAGE RESISTANCE AND CHEMICAL INTEGRITY

FIELD OF THE INVENTION

The invention relates to semiconductor fabrication. More particularly, the invention relates to methods of forming low-k (dielectric constant) dielectric layers and films with improved damage resistance and chemical integrity, to retain the low dielectric constant of the layers and films after subsequent semiconductor processing.

BACKGROUND OF THE INVENTION

Progressively more sophisticated interconnection technology is needed as VLSI technology drops below 0.13 μm. This decrease in device size has made it increasingly more difficult to provide an interconnection technology that satisfies the requirements of low resistance capacitance (RC) metal interconnect properties.

Signal transport speed is a very important concern in the semiconductor processing art for obvious performance reasons. The signal transport speed of semiconductor circuitry (RC time constant) varies inversely with the RC of the metal interconnections. As integrated circuits become more complex and feature sizes decrease, the effect of the RC time constant on signal delay becomes greater.

Insulating inter-metal dielectric (IMD) layers are typically used in back-end semiconductor processing to fabricate metal interconnect structures. The IMD layers, however, contribute capacitance to the metal interconnect structures which undesirably reduces the signal transport speed of the semiconductor circuitry.

Methods have been devised to reduce the capacitance contribution of the IMD layers to the RC time constant, in order to increase signal transport speed of the semiconductor circuitry. One method that reduces the capacitance contribution of the IMD layers and thus, allows faster signal transport speeds, involves forming the IMD layers with a low-k dielectric material. Unfortunately, low-k dielectric materials have loss chemical bonding structures (Si—$CH_3$), large pore sizes, and high interconnectivity between pores. Hence, subsequently performed semiconductor patterning processes such as etching, ashing, deposition, and wet processes, to name a few, often damage low-k dielectric materials, which in turn, degrades (increase) their dielectric constants.

FIG. 1 depicts a plurality of bar graphs which compare the dielectric constants of conventionally formed low-k dielectric films before and after performing various etching and cleaning processes associated with, for example, semiconductor patterning. As can be seen, each conventionally formed, low-k dielectric film exhibited an increase in dielectric constant (i.e., dielectric constant degradation). The increases in dielectric constant are due to the physical and/or chemical damage sustained by the low-k films during the etching and/or cleaning processes.

Accordingly, an easily implemented method is needed for forming low-k dielectric layers and films with improved damage resistance and dielectric constant stability.

SUMMARY

A method is disclosed herein for forming a low-k dielectric layer or film. In one embodiment, a porous low-k dielectric layer or film is formed over a wafer or substrate. Then, active bonding is introduced into the porous low-k dielectric layer or film by introducing OH and/or H radicals into pores formed in the porous low-k dielectric layer or film.

The active bonding (e.g., Si—OH and/or Si—H) improves the damage resistance of the low-k dielectric layer or film.

In some embodiments, the active bonding may be introduced into the low-k dielectric layer or film using various "water" injection and curing methods.

In some embodiments, the active bonding is removed from the low-k dielectric layer or film.

DETAILED DESCRIPTION OF THE INVENTION

The low-k dielectric layers and films with improved damage resistance and chemical integrity disclosed herein may, in some embodiments, be used in back-end semiconductor processing as IMD layers in the fabrication of metal interconnect structures. It should be understood, however, that these low-k dielectric layers and films may also be used for other purposes and structures.

Figure 1:
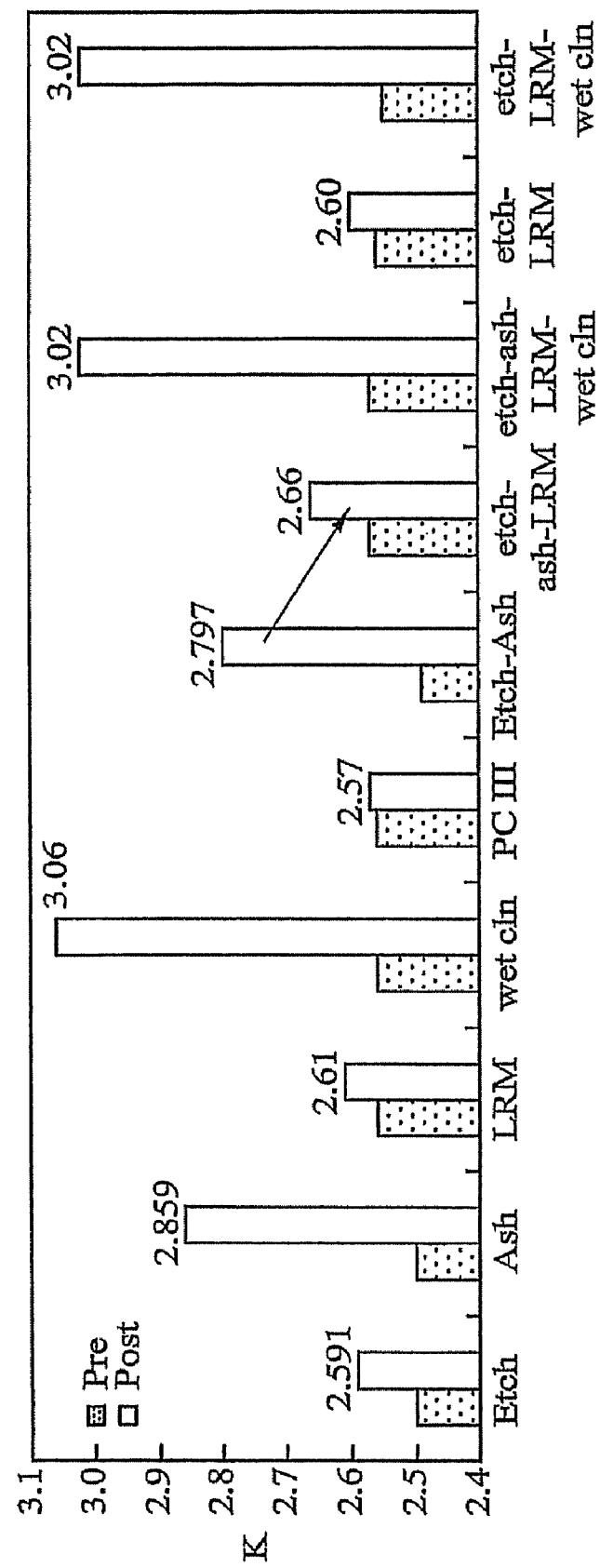
FIG. 1 are bar graphs comparing the dielectric constants of conventionally formed low-k dielectric films before and after performing various etching and cleaning processes associated with semiconductor patterning.
Figure 2:
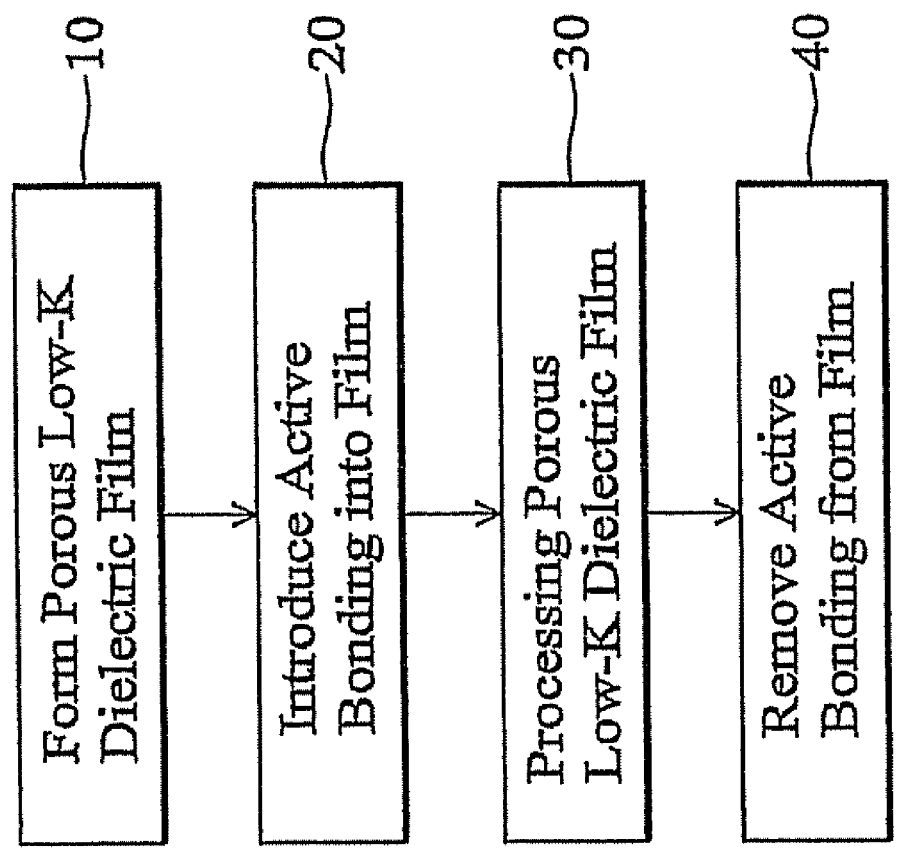
FIG. 2 is a flowchart showing the processing steps of an exemplary embodiment of a method for forming a low-k dielectric layer or film with improved damage resistance and chemical integrity.

FIG. 2 is a flowchart showing the processing steps of an exemplary embodiment of the method. The method commences in step 10, with the formation of a porous low-k dielectric material layer or film (low-k dielectric film) 300 over a semiconductor wafer or substrate 100 (FIG. 3B). In some exemplary embodiments, the semiconductor wafer or substrate 100 may have active and passive devices formed therein. In some exemplary embodiments, the wafer or substrate 100 may be composed of silicon.

In one exemplary embodiment, the porous low-k dielectric film 300 may have a low dielectric constant of less than about 3.0 and preferably 2.5 or less. The porous low-k dielectric film 300 may have a thickness of about 800 to about 6000 angstroms, although porous low-k films of other thicknesses are possible. In one exemplary embodiment, the porous low-k dielectric film 300 may comprise a Si based compound, such as a Si—O—C—H, having structure comprising a network of pores dispersed throughout a rigid dielectric matrix. The porous low-k dielectric film 300 may have an average pore size ranging from about 5 angstroms (about 9% volume fraction in the film) to about 20 angstroms (about 91% volume fraction in the film).

Figure 3A:
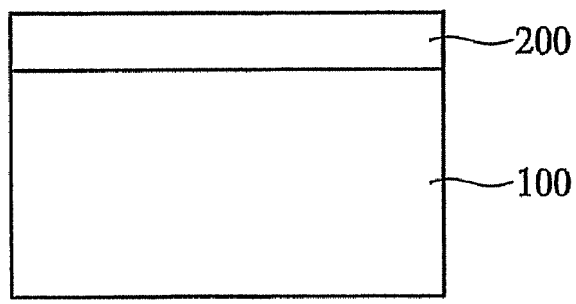
FIGS. 3A-3E are cross-sectional views of a portion of an exemplary semiconductor structure at different stages of the method.
Figure 3B:
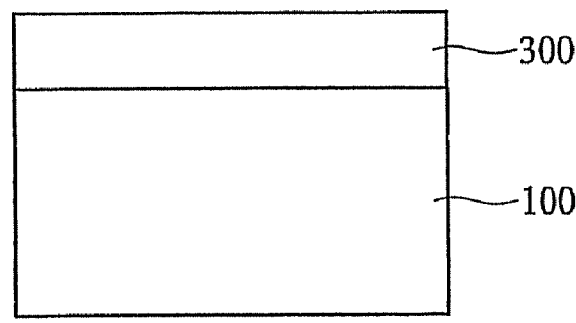

In some exemplary embodiments, the porous low-k dielectric film 300 may be formed by co-depositing a dielectric matrix forming material and a sacrificial or labile pore forming material (porogen) onto the wafer or substrate 100 to form a porogen containing film 200 as shown in FIG. 3A. The porogen containing film 200 is converted to the porous low-k dielectric film 300 shown in FIG. 3B by curing the film 200 in a process which removes the porogen from film 200.

The co-deposition of the dielectric matrix material and the porogen may be performed using, for example, a plasma enhanced chemical vapor deposition (PECVD) process, a spin-on-deposition process, or any other suitable and appropriate deposition process which is capable of co-depositing the dielectric matrix material and the porogen to form the porogen containing film 200. In the PECVD process, precursors for the film matrix and the porogen are introduced into a plasma to chemical-vapor-deposit the porogen containing film 200 over the wafer or substrate 100 shown in FIG. 3A. In one exemplary embodiment, the PECVD process may be performed at a temperature ranging from about 150° C. to about 300° C., a pressure ranging from about 3 mtorr to about 10 mtorr, at an ATRP/mDEOS flow ranging between about 500 to about 5000/about 700 to about 3000, and at an RF power of about 200 watts to about 650 watts.

In the spin-on-deposition process, a porogen precursor is added to a dielectric matrix precursor liquid solution. The mixture of the porogen precursor and dielectric matrix precursor liquid solution, is spin cast deposited onto the wafer or substrate 100 to form the porogen containing film 200 shown in FIG. 3A.

The porogen containing film 200 may be converted to the porous low-k dielectric film 300 shown in FIG. 3B using a curing process, which removes the porogen that results in the network of pores in the low-k film 300. The curing process may be performed at a high temperature of about 250 to about 450° C. The curing process may be performed conventionally using, for example, a thermal curing process, a UV curing process, an E-beam curing process, a supercritical CO2 curing process, combinations thereof, or any other suitable and appropriate curing process which is capable of removing the porogen in film 200 to form the porous low-k dielectric film 300.

The pore size and porosity of the porous low-k film 300 are generally controlled by the deposition process parameters, the total amount of porogen that is incorporated into the film 200 and the curing process parameters. The selection of dielectric matrix precursor is based on certain factors including, for example, process compatibility; the RF power used for matrix formation, which is approximately equal to the RF power needed for porogen deposition (applicable only to embodiments using PECVD); and the mechanical properties desired of the low-k dielectric film 300. The selection of the porogen precursor is also based on certain factors including process compatibility; the molecular weight/vapor pressure of the porogen precursor; and the cyclic structure of the porogen precursor, to name a few. In one exemplary embodiment, the dielectric matrix precursor material may comprise mDEO or DEMS (Diethoxymethylsilane) and the porogen precursor material may comprise alpha-Terpinene (1-methyl-4-(1-methylethyl)-1,3-cyclohexadiene).

Figure 3C:
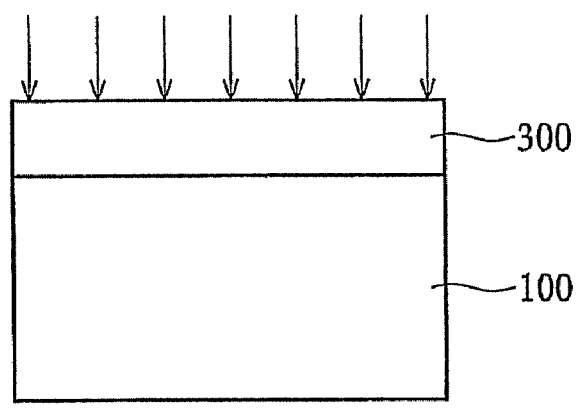

Referring again to FIG. 2, after formation of the porous low-k dielectric film 300, active bonding is introduced into the porous low-k dielectric film 300 in step 20. This may be accomplished in one exemplary embodiment by introducing OH and/or H radicals into the pores formed in the film 300 as depicted in FIG. 3C. The active bonding may comprise Si—OH and/or Si—H bonds in embodiments where the porous low-k dielectric film 300 comprises the earlier mentioned Si based compound. In some exemplary embodiments, the OH and/or H radicals may be introduced into the pores by subjecting the porous low-k dielectric film 300 to an aqueous medium. In one exemplary embodiment, OH and/or H radicals may be introduced into the pores of the low-k dielectric film using a conventional chemical mechanical polishing (CMP) process combined with a conventional wet cleaning process. In other exemplary embodiments, a conventional dipping and scrubbing process in citric acid ($C_6H_8O_7$) or a fluoride amine based solvent may be used to introduce OH and/or H radicals into the pores of the porous dielectric film 300.

In one embodiment where the porous low-k dielectric film 300 comprises a Si-based compound, the percentages of Si—OH bonds and Si—H bonds in the SiO network of the film 300, prior to the introduction of the active bonding, are approximately 0% and less than 2%, respectively. After the introduction of active bonding, the percentages of Si—OH bonds and Si—H bonds in the SiO network of the film 300 are greater than 3% and greater than 2%, respectively.

The active bonds (e.g., Si—OH and/or Si—H active bonds) and primarily the OH based active bonds, enhance the physical strength and chemical integrity of the low-k dielectric film 300. This in turn allows a low-k dielectric film to be subjected to damage conditions (e.g., semiconductor patterning) and substantially retain its low dielectric constant, after removal of the active bonds from the film.

The enhanced physical strength and chemical integrity achieved by introducing active bonds into the low-k dielectric film is believed to be due to the fact that many dangling/unbonded bonds exist in the low-k film after removal of the porogen. It is, therefore, quite easy for some undesired bonds to form (e.g., Si—F, Si—N . . . ) and/or some undesired chemicals to penetrate into the bulk of the low-k film during a subsequently performed semiconductor fabrication process, such as patterning (e.g., etching, cleaning). The introduction of the OH and H active bonds prior to further semiconductor processing, prevents the chemicals used in further semiconductor processing from bonding with the dangling/unbonded bonds in the low-k film, thus improving the damage resistance and chemical integrity of the film.

Figure 3D:
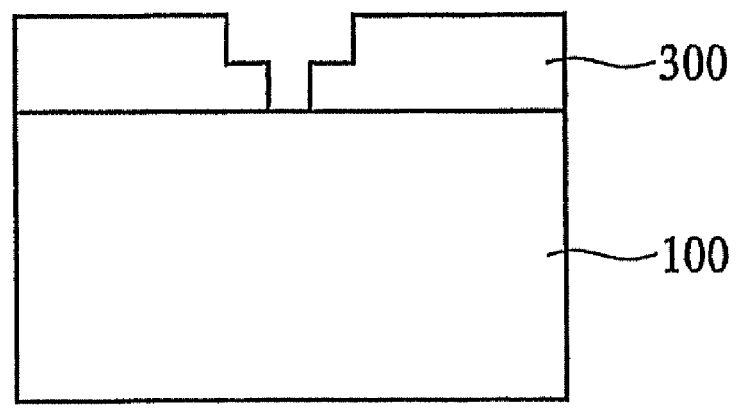

Referring again to FIG. 2, the low-k dielectric film 300 containing the active bonding may be subsequently processed in step 30. In some embodiments, the subsequent processing may comprise a semiconductor patterning process, such as etching, wafer/substrate cleaning, and the like. FIG. 3D shows the wafer or substrate 100 and the low-k dielectric film 300 after such a patterning process.

Figure 3E:
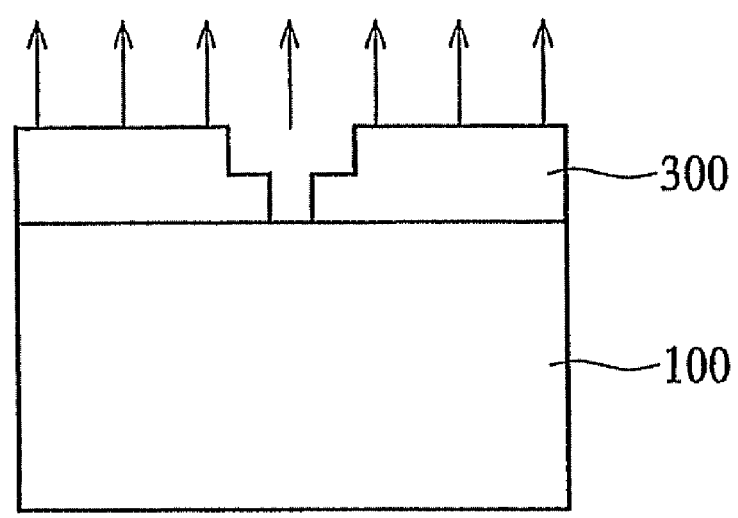

The active bonding temporarily increases the dielectric constant of the low-k dielectric film 300. Therefore, in step 40 of FIG. 2, the active bonding is removed from the low-k dielectric film 300 to substantially return the dielectric constant of the low-k film 300 to its original low value. FIG. 3E depicts the removal of the active bonding from the low-k dielectric film 300. In some embodiments, active bonding removal is accomplished by subjecting the wafer or substrate 100 to a thermal degassing process. In one embodiment, the thermal degassing process may be performed by heating the wafer or substrate 100 to about 400° C. for about 10 minutes.

Figure 4:
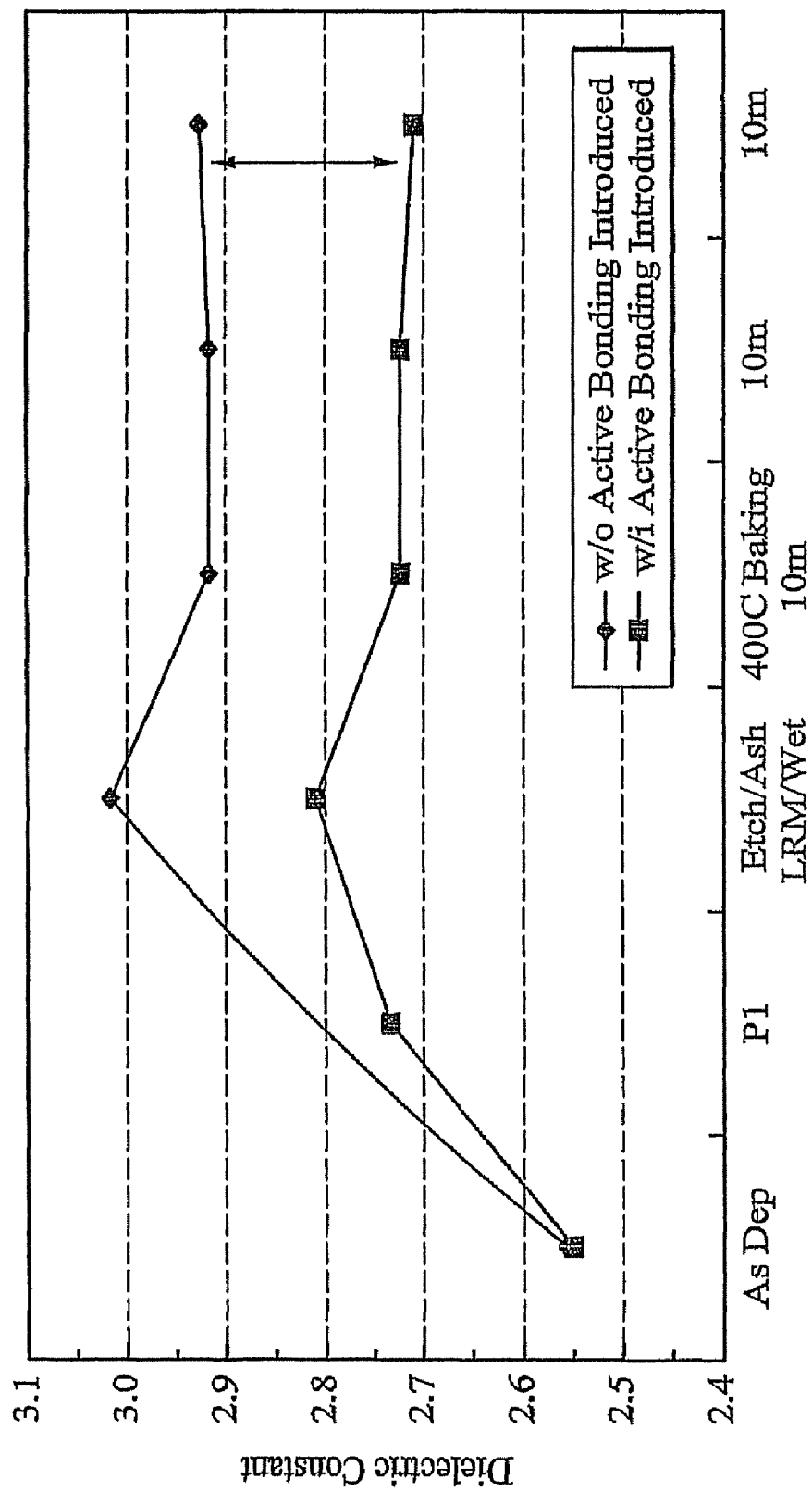
FIG. 4 is a graph plotting the dielectric constants of two low-k dielectric films, i.e., one without active bonding and one containing active bonding, after deposition of the films, after patterning of the films, and after thermal degassing of the films.

FIG. 4 is a graph plotting the dielectric constants of two low-k dielectric films, i.e., one without active bonding and one containing active bonding, after deposition of the films, after patterning of the films, and after thermal degassing of the films. As shown in FIG. 4, the dielectric constant of the low-k dielectric film containing the active bonding was 0.2 lower than the low-k dielectric film without the active bonding, after patterning and thermal degassing.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method of forming a low-k dielectric layer or film, comprising the steps of:
    forming a porous low-k dielectric layer or film over a wafer or substrate;
    introducing active bonding into the porous low-k dielectric layer or film prior to further processing of the porous low-k dielectric layer or film, the introducing step performed by a combination chemical mechanical polishing and wet cleaning process;
    patterning the low-k dielectric layer or film to modify, alter, or change a characteristic of the layer or film, after introducing the active bonding into the porous low-k dielectric layer; and
    removing the active bonding from the low-k dielectric layer or film.

2. The method according to claim 1, wherein the introducing step includes introducing at least one of an OH radical and an H radical into pores formed in the porous low-k dielectric layer or film.

3. The method according to claim 1, wherein the forming step comprises the step of co-depositing a dielectric matrix forming material and a porogen forming material onto the wafer or substrate to form a porogen containing layer or film.

4. The method according to claim 3, wherein the forming step further comprises the step of converting the porogen containing film to the porous low-k dielectric layer or film.

5. The method according to claim 4, wherein the converting step is performed by removing the porogen from the layer or film.

6. The method according to claim 5, wherein the removing step comprises curing the layer or film.

7. The method according to claim 6, wherein the curing is performed by heating the layer or film.

8. The method according to claim 1, wherein the porous low-k dielectric layer or film comprises a Si based compound.

9. The method according to claim 8, wherein the introducing step includes introducing at least one of an OH radical and an H radical into pores formed in the porous low-k dielectric layer or film.

10. The method according to claim 9, wherein the at least one of the OH and H radicals introduced into pores form at least one of Si—OH active bonds and Si—H active bonds in the low-k dielectric layer or film.

11. A method of forming a low-k dielectric layer or film, comprising the steps of:
    forming a porous low-k dielectric layer or film over a wafer or substrate;
    introducing active bonding into the porous low-k dielectric layer or film prior to further processing of the porous low-k dielectric layer or film, the introducing step performed by a dipping and scrubbing process;
    patterning the low-k dielectric layer or film to modify, alter, or change a characteristic of the layer or film, after introducing the active bonding into the porous low-k dielectric layer; and
    removing the active bonding from the low-k dielectric layer or film.

12. The method according to claim 11, wherein the introducing step includes introducing at least one of an OH radical and an H radical into pores formed in the porous low-k dielectric layer or film.

13. The method according to claim 11, wherein the forming step comprises the step of co-depositing a dielectric matrix forming material and a porogen forming material onto the wafer or substrate to form a porogen containing layer or film.

14. The method according to claim 13, wherein the forming step further comprises the step of converting the porogen containing film to the porous low-k dielectric layer or film.

15. The method according to claim 14, wherein the converting step is performed by removing the porogen from the layer or film.

16. The method according to claim 15, wherein the removing step comprises curing the layer or film.

17. The method according to claim 16, wherein the curing is performed by heating the layer or film.

18. The method according to claim 11, wherein the porous low-k dielectric layer or film comprises a Si based compound.

19. The method according to claim 18, wherein the introducing step includes introducing at least one of an OH radical and an H radical into pores formed in the porous low-k dielectric layer or film.

20. The method according to claim 19, wherein the at least one of the OH and H radicals introduced into pores form at least one of Si—OH active bonds and Si—H active bonds in the low-k dielectric layer or film.

21. The method according to claim 11, wherein the dipping and scrubbing process uses citric acid or a fluoride amine based solvent.

* * * * *

UNITED STATES PATENT AND TRADEMARK OFFICE
CERTIFICATE OF CORRECTION

| | | |
|---|---|---|
| PATENT NO. | : 8,043,959 B2 | Page 1 of 1 |
| APPLICATION NO. | : 11/379708 | |
| DATED | : October 25, 2011 | |
| INVENTOR(S) | : Keng-Chu Lin et al. | |

It is certified that error appears in the above-identified patent and that said Letters Patent is hereby corrected as shown below:

Title Page, Item (12) "Iin et al." should read --Lin et al.--

Title Page - Item (75) Inventors - First named inventor's family name "Iin", should read "Lin".

Signed and Sealed this
Tenth Day of January, 2012

David J. Kappos
*Director of the United States Patent and Trademark Office*